United States Patent
Perzlmaier et al.

(10) Patent No.: US 10,217,792 B2
(45) Date of Patent: Feb. 26, 2019

(54) METHOD FOR PRODUCING AN OPTOELECTRONIC SEMICONDUCTOR CHIP AND OPTOELECTRONIC SEMICONDUCTOR CHIP

(71) Applicant: OSRAM Opto Semiconductors GmbH, Regensburg (DE)

(72) Inventors: Korbinian Perzlmaier, Regensburg (DE); Lutz Hoeppel, Alteglofsheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/739,102

(22) PCT Filed: Jul. 11, 2016

(86) PCT No.: PCT/EP2016/066441
§ 371 (c)(1),
(2) Date: Dec. 21, 2017

(87) PCT Pub. No.: WO2017/009292
PCT Pub. Date: Jan. 19, 2017

(65) Prior Publication Data
US 2018/0190711 A1    Jul. 5, 2018

(30) Foreign Application Priority Data
Jul. 15, 2015 (DE) .................. 10 2015 111 487

(51) Int. Cl.
*H01L 33/00* (2010.01)
*H01L 33/48* (2010.01)
(Continued)

(52) U.S. Cl.
CPC ............ *H01L 27/15* (2013.01); *H01L 29/872* (2013.01); *H01L 33/382* (2013.01);
(Continued)

(58) Field of Classification Search
CPC ..... H01L 27/15; H01L 29/872; H01L 29/247; H01L 29/1604; H01L 33/62;
(Continued)

(56) References Cited

U.S. PATENT DOCUMENTS 7,897,497 B2 * 3/2011 Kamii .................. H01L 27/15
257/E29.032
2005/0168899 A1 * 8/2005 Sato ...................... H01L 27/15
361/91.1
(Continued)

FOREIGN PATENT DOCUMENTS

DE    102008022942 A1    11/2009
DE    102008034560 A1    2/2010
(Continued)

OTHER PUBLICATIONS

Pankove, Jacques I. "Hydrogenated amorphous silicon. Device applications" 1984. p. 122.
(Continued)

*Primary Examiner* — Dao H Nguyen
(74) *Attorney, Agent, or Firm* — McDermott Will & Emery LLP

(57) ABSTRACT

The invention relates to a method for producing an optoelectronic semiconductor chip (1). A semiconductor layer sequence (3) is provided, comprising a first semiconductor layer (3a) and a second semiconductor layer (3b). Furthermore, a first contact layer (5a) is provided which extends laterally along the first semiconductor layer (3a) and electrically contacts same. A third semiconductor layer (7) is applied onto a first contact layer (5a) face facing away from
(Continued)

Figure 1:
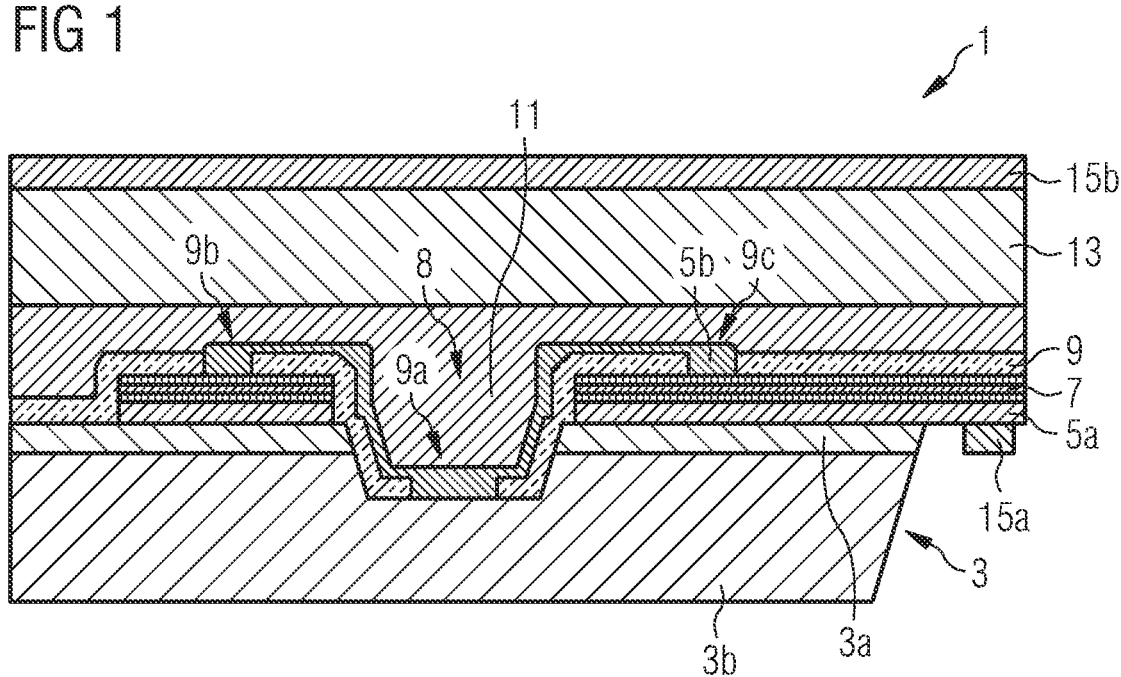

the semiconductor layer sequence (3). A recess (8) is formed which extends through the third semiconductor layer (7), the first contact layer (5a), and the first semiconductor layer (3a) into the second semiconductor layer (3b). A passivation layer (9) is applied onto a third semiconductor layer (7) face facing away from the semiconductor layer sequence (3). At least one first (9a) and at least one second passage opening (9b, 9c) are formed in the passivation layer (9). A second contact layer (5b) is applied which electrically contacts the second semiconductor layer (3b) in the region of the at least one first passage opening (9a) and the third semiconductor layer (7) in the region of the at least one second passage opening (9b, 9c). The invention additionally relates to an optoelectronic semiconductor chip (1).

20 Claims, 3 Drawing Sheets

(51) Int. Cl.
  H01L 21/22    (2006.01)
  H01L 27/15    (2006.01)
  H01L 33/38    (2010.01)
  H01L 33/40    (2010.01)
  H01L 33/44    (2010.01)
  H01L 29/872   (2006.01)
  H01L 33/62    (2010.01)
  H01L 33/20    (2010.01)
  H01L 33/30    (2010.01)
  H01L 33/42    (2010.01)
  H01L 29/16    (2006.01)
  H01L 29/24    (2006.01)
  H01L 33/32    (2010.01)

(52) U.S. Cl.
  CPC ............ *H01L 33/387* (2013.01); *H01L 33/40* (2013.01); *H01L 33/44* (2013.01); *H01L 33/62* (2013.01); *H01L 29/1604* (2013.01); *H01L 29/247* (2013.01); *H01L 33/20* (2013.01); *H01L 33/30* (2013.01); *H01L 33/32* (2013.01); *H01L 33/42* (2013.01); *H01L 2933/0016* (2013.01); *H01L 2933/0025* (2013.01); *H01L 2933/0066* (2013.01)

(58) Field of Classification Search
  CPC ..... H01L 33/387; H01L 33/382; H01L 33/40; H01L 33/44; H01L 33/32; H01L 33/42; H01L 33/20; H01L 33/30
  USPC .............. 257/76, 98, 99, 192, 194, E21.403, 257/E27.12, E29.004, E29.032, E29.246, 257/E33.001, E33.023, E33.055, E33.062, 257/E33.066; 361/91.1; 438/22, 23, 46, 438/47, 168, 172, 545
  See application file for complete search history.

(56) References Cited

U.S. PATENT DOCUMENTS

| | | |
|---|---|---|
| 2006/0060880 A1 | 3/2006 | Lee et al. |
| 2007/0284606 A1 | 12/2007 | Sugimori |
| 2009/0201042 A1 | 8/2009 | Sellathamby et al. |
| 2011/0147466 A1 | 6/2011 | Kang et al. |
| 2011/0180831 A1 | 7/2011 | Song |
| 2011/0260210 A1 | 10/2011 | Su |
| 2011/0291148 A1* | 12/2011 | Sugizaki ............. H01L 33/44 257/99 |
| 2013/0020598 A1 | 1/2013 | Yang et al. |
| 2015/0084080 A1 | 3/2015 | Kawakita et al. |
| 2015/0097208 A1 | 4/2015 | Sugizaki et al. |
| 2015/0179629 A1 | 6/2015 | Ko et al. |
| 2015/0364665 A1* | 12/2015 | Lopez ............. H01L 33/382 257/99 |
| 2016/0005941 A1* | 1/2016 | Tsai ............. H01L 33/382 257/98 |

FOREIGN PATENT DOCUMENTS

| | | |
|---|---|---|
| DE | 102009032486 A1 | 1/2011 |
| DE | 102009053064 A1 | 5/2011 |
| DE | 102010027679 A1 | 1/2012 |
| DE | 102012105619 A1 | 1/2014 |
| DE | 102012106364 A1 | 1/2014 |
| DE | 102013110853 A1 | 4/2015 |
| DE | 102013112881 A1 | 5/2015 |
| DE | 102014112673 A1 | 3/2016 |
| EP | 2402995 A2 | 1/2012 |
| JP | S58-79746 A | 5/1983 |
| JP | H05-110073 A | 4/1993 |
| JP | 2001-203428 A | 7/2001 |
| JP | 2012-138499 A | 7/2012 |
| JP | 2013-122951 A | 6/2013 |
| JP | 2015-092547 A | 5/2015 |
| WO | 2013121787 A1 | 8/2013 |
| WO | 2013187318 A1 | 12/2013 |

OTHER PUBLICATIONS

Street, R. A. "Technology and applications of amorphous silicon" Springer, 1999. Section 2.3.5.
Notice of Reasons for Rejection dated Dec. 18, 2018 for Japanese Application No. 2017-568302, and English ranslation thereof.

* cited by examiner

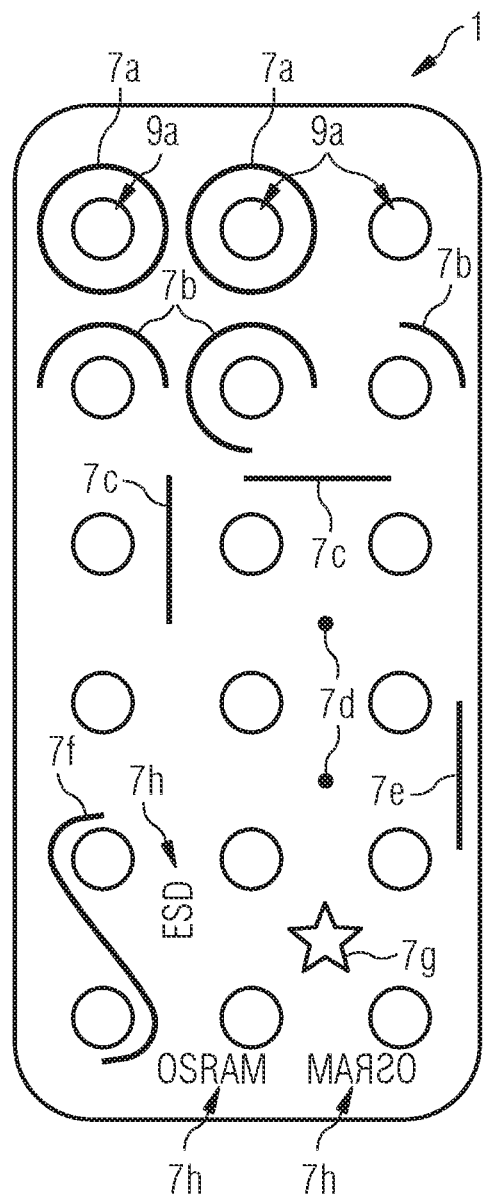

METHOD FOR PRODUCING AN OPTOELECTRONIC SEMICONDUCTOR CHIP AND OPTOELECTRONIC SEMICONDUCTOR CHIP

This patent application claims the priority of the German patent application DE 10 2015 111 487.9, the disclosure of which is incorporated herein by reference.

A method for producing an optoelectronic semiconductor chip and an optoelectronic semiconductor chip are provided.

It is an object to provide a method which contributes to producing an optoelectronic semiconductor chip in a simple and cost-efficient manner. Furthermore, it is an object to provide an optoelectronic semiconductor chip, which is characterized by a low sensitivity toward electrostatic discharge (ESD) and which can be produced in a comparatively simple manner.

These objects are achieved by the independent patent claims. Advantageous embodiments and developments of the invention are indicated in the sub-claims.

According to a first aspect, a method for producing an optoelectronic semiconductor chip is provided. The optoelectronic semiconductor chip particularly is an LED chip or a photo-diode chip. For example, the optoelectronic semiconductor chip is a thin-film light-emitting diode (LED), which is free from a growth substrate for a semiconductor layer sequence.

The optoelectronic semiconductor chip extends in a vertical direction between a first main plane and a second main plane, wherein the vertical direction can extend transversally or vertically to the first and/or second main plane. The main planes can be main extension planes in the cover surface and the bottom surface of the optoelectronic semiconductor chip, for example. The optoelectronic semiconductor chip extends in a planar manner in a lateral direction, i.e. at least partially parallel to the main planes, for example. For example, the optoelectronic semiconductor chip has a thickness in the vertical direction that is small compared to a maximum extension of the optoelectronic semiconductor chip in the lateral direction.

In at least one embodiment according to the first aspect, a semiconductor layer sequence is provided, including a first semiconductor layer and a second semiconductor layer. The semiconductor layer sequence extends in a planar manner at least in places parallel to the main surfaces. For example, the semiconductor layer sequence forms the first main plane of the optoelectronic semiconductor chip, e.g. the cover surface of the optoelectronic semiconductor chip. In particular, the semiconductor layer sequence contains an active region provided for generating radiation and/or receiving radiation. The semiconductor layer sequence can be grown on a growth substrate in an epitaxial manner. The above mentioned vertical direction corresponds to the growth direction then, for example.

The semiconductor layer sequence, in particular the active region, contains a III-V semiconductor compound material, for example. III-V semiconductor compound materials are particularly suitable for generating radiation in the ultraviolet spectral range ($Al_xIn_yGa_{1-x-y}N$) to the visible range ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. Here, in each case $0 \leq x \leq 1$, $0 \leq y \leq 1$, $x+y \leq 1$, in particular with $x \neq 1$, $y \neq 1$, $y \neq 0$ and/or $y \neq 0$ applies. Furthermore, high quantum yields can be achieved with III-V semiconductor materials, in particular of the mentioned material systems.

The first semiconductor layer and the second semiconductor layer expediently comprise different conduction types. In particular, the first semiconductor layer can be a p-doped semiconductor layer and the second semiconductor layer can be an n-doped semiconductor layer.

In at least one embodiment according to the first aspect, a first contact layer is provided, which extends laterally along the first semiconductor layer and electrically contacts the same.

The first contact layer extends particularly in a planar manner on a side of the first semiconductor layer facing away from the second semiconductor layer. The first contact layer can for example also be referred to as p-connection layer. In particular, the first contact layer comprises a metal or consists thereof. The first contact layer can be reflecting for the radiation emitted by the active layer, for example, in order to reflect radiation emitted in the direction of the second main plane to a radiation exit surface of the optoelectronic semiconductor chip. In particular, the first contact layer can be formed as a reflecting contact layer and preferably contain silver or aluminum. As an alternative, the first contact layer can be formed transparent, for example. In particular, the first contact layer can comprise a transparent conductive oxide (TCO) to that end. Transparent conductive oxides are transparent conductive materials, usually metal oxides such as zinc oxide, tin oxide, cadmium oxide, titanium oxide, indium oxide, or indium tin oxide (ITO).

In at least one embodiment according to the first aspect, a third semiconductor layer is applied on a side of the first contact layer facing away from the semiconductor layer sequence. The third semiconductor layer is e.g. an amorphic material such as amorphous silicon (s-Si) or a hydrogenated amorphous silicon (a-Si:H). The third semiconductor layer covers the first contact layer in a planar manner, for example. In particular, the first contact layer is covered with the third semiconductor layer in a deposition step.

In at least one embodiment according to the first aspect, a recess is formed, which extends through the third semiconductor layer, the first contact layer and the first semiconductor layer and into the second semiconductor layer. In particular in a region of the recess, the third semiconductor layer, the first contact layer and the first semiconductor layer are laterally interrupted.

In at least one embodiment according to the first aspect, a passivation layer is applied on a side of the third semiconductor layer facing away from the semiconductor layer sequence. The passivation layer covers the third semiconductor layer in a planar manner, for example. In particular, the passivation layer extends into the recess and covers a respective lateral side surface of the semiconductor layer and/or of the first contact layer and/or of the first semiconductor layer facing the recess, for example.

In at least one embodiment according to the first aspect, at least one first through-opening is formed in the passivation layer. The at least one first through-opening extends in the vertical direction in particular completely through the passivation layer so that the passivation layer is interrupted in the region of the respective first through-opening. For example, an etching process is used to that end. In particular, the at least one first through-opening is formed in the region of the recess, so that the second semiconductor layer is exposed after this step from the second main plane in the region of the at least one first through-opening.

In at least one embodiment according to the first aspect, at least a second through-opening is formed in the passivation layer. The at least one second through-opening extends in the vertical direction, in particular completely through the passivation layer, so that the passivation layer is completely interrupted in the region of the respective second through-opening. An etching process is applied to that end, for example.

In particular, the applied process may correspond to the method for forming the at least one first through-opening. In particular, the at least one second through-opening is formed in the region of the third semiconductor layer, so that it is exposed after this step from the second main plane in the region of the at least one second through-opening.

In at least one embodiment according to the first aspect, a second contact layer is applied, which electrically contacts the second semiconductor layer in the region of the at least one first through-opening and electrically contacts the third semiconductor layer in the region of the at least one second through-opening. The second contact layer can also be referred to as n-connection layer, for example. In particular, the second contact layer comprises a metal or consists thereof.

The second contact layer can be reflecting for radiation emitted by the active layer, for example, in order to reflect radiation emitted in the direction of the second main plane to a radiation exit surface of the optoelectronic semiconductor chip. The second contact layer can in particular be formed as a reflecting contact layer and preferably contain silver or aluminum.

As an alternative, the second contact layer can be formed to be transparent. In particular, the second contact layer can comprise a transparent conductive oxide (TCO) to that end.

For example, the second contact layer can comprise a solder layer or consist of such a layer. In particular, the solder layer can extend in a planar manner along the passivation layer, so that a respective contact surface of the second contact layer are electrically connected to one another in the region of the at least one first through-opening and in the region of the at least one second through-opening. Alternatively, or additionally, the respective contact surfaces can be electrically connected independently from the solder layer. In particular, the respective contact surface can be formed in a contiguous manner in one piece, for example.

In at least one embodiment according to the first aspect, a semiconductor layer sequence is provided, including a first semiconductor layer and a second semiconductor layer. Furthermore, a first contact layer is provided, which extends laterally along the first semiconductor layer and electrically contacts the same. A third semiconductor layer is applied on a side of the first contact layer facing away from the semiconductor layer sequence. A recess is formed, which extends through the third semiconductor layer, the first contact layer and the first semiconductor layer and into the second semiconductor layer.

A passivation layer is applied on a side of the third semiconductor layer facing away from the semiconductor layer sequence. At least a first and at least a second through-opening are formed in the passivation layer. A second contact layer is applied, which electrically contacts the second semiconductor layer in the region of the at least one first through-opening and electrically contacts the third semiconductor layer in the region of the at least one second through-opening. The first and the second contact layer are electrically insulated from one another by the passivation layer. Advantageously, both the first semiconductor layer and the second semiconductor layer can be contacted from the second main plane. This provides the advantage that a radiation exit surface of the semiconductor chip opposite the second main plane can be free of connection layers. The radiation efficiency is advantageously increased in this way.

Advantageously, the first and the second contact layer additionally serve as electric contacts of the third semiconductor layer. In particular, the first and second contact layer form a Schottky diode together with the third semiconductor layer. The Schottky diode is in particular connected in parallel or antiparallel to the semiconductor layer sequence. Advantageously, the Schottky diode can be used as an ESD protective element. This allows a low sensitivity of the optoelectronic semiconductor chip toward short-circuits and/or electrostatic discharge. In particular, the ESD protective element is integrated in the optoelectronic semiconductor chip so that an ESD protective element arranged externally to the optoelectronic semiconductor chip, e.g. a housing of the optoelectronic semiconductor chip with ESD protection, can be dispensed with. In a particularly advantageous manner, this contributes to a simple and cost-efficient production of the optoelectronic semiconductor chip. Furthermore, radiation efficiency is not affected by the integration of the ESD protective element. In particular, a separate semiconductor layer sequence to be produced elaborately for an ESD protective element can be dispensed with. A resulting reduction of the active area of the optoelectronic semiconductor chip can thus be prevented.

In at least one embodiment according to the first aspect, additionally a part of the passivation layer is applied on a side of the first contact layer facing away from the semiconductor layer sequence. At least one further through-opening is formed in the passivation layer, so that the first contact layer electrically contacts the third semiconductor layer in the region of the at least one further through-opening.

For example, the passivation layer is applied in multiple method steps. The passivation layer can in particular include one or multiple sub-layers, which do not necessarily have to consist of the same material or be applied in a same method. Appling the passivation layer or a sub-layer thereof on the first contact layer as well as forming the at least one further through-opening allows adjusting a size of a contact surface between the first contact layer and the third semiconductor layer. After this step, the passivation layer is in particular arranged on opposite sides of the third semiconductor layer.

According to a second aspect, a method for producing an optoelectronic semiconductor chip is provided. A semiconductor layer sequence is provided, including a first semiconductor layer and a second semiconductor layer.

Furthermore, a first contact layer is provided, which extends laterally along the first semiconductor layer and electrically contacts the same. A recess is formed, which extends through the first contact layer and the first semiconductor layer and into the second semiconductor layer. A passivation layer is applied on a side of the first contact layer facing away from the semiconductor layer sequence. At least a first and at least a second through-opening are formed in the passivation layer.

A third semiconductor layer is formed on a side of the first contact layer facing away from the semiconductor layer sequence. A second contact layer is applied, which electrically contacts the second semiconductor layer in the region of the at least one first through-opening and electrically contacts the third semiconductor layer in the region of the at least one second through-opening.

Forming the third semiconductor layer particularly includes an application of the third semiconductor layer with a subsequent structuring. Advantageously, the third semiconductor layer is laterally surrounded by the passivation layer after this step. The first and second contact layer form a Schottky diode together with the third semiconductor layer in analogy to the first aspect.

In at least one embodiment according to the first or second aspect, a carrier can be applied on a side of the second contact layer facing away from the first main plane. The carrier can be formed of silicon or a mold such as cast resin or silicone, for example. For example, the optoelectronic semiconductor chip is a thin film chip or a so-called "mold supported chip". Alternatively or additionally, a carrier can be applied on a side of the semiconductor layer sequence facing away from the second main plane and e.g. form a part of the radiation exit surface or the first main plane. For example, this carrier is formed from sapphire. The optoelectronic semiconductor chip is a so-called "flip chip", for example.

In at least one embodiment according to the first or second aspect, the through-openings are formed by means of a chemical process. This process can in particular be a dry-chemical process such as dry-etching, or a wet-chemical process. Advantageously this allows a simultaneous forming of the through-openings, which contributes to an efficient production of the optoelectronic semiconductor chip.

In at least one embodiment according to the first or second aspect, the recess extends completely through the third semiconductor layer, the first contact layer and the first semiconductor layer and into the second semiconductor layer. This allows a through-connecting of the second semiconductor layer from the second main plane of the optoelectronic semiconductor chip. In particular, a respective electric contacting of the first semiconductor layer and of the second semiconductor layer can be effected from the same side of the optoelectronic semiconductor chip. This can contribute to a high radiation efficiency of the optoelectronic semiconductor chip, for example. Furthermore, the optoelectronic semiconductor chip can be configured to be able to be surface-mounted.

In at least one embodiment according to the first or second aspect, the through-openings are formed in a common method step. Advantageously, this contributes to an especially high efficiency in the production of the optoelectronic semiconductor chip. In particular, forming the at least one second through-opening can be effected simultaneously with a forming of the at least one first through-opening, so that an additional photo plane in the context of a photolithographic process can be omitted.

According to a third aspect, an optoelectronic semiconductor chip is provided. The optoelectronic semiconductor chip can in particular be produced with a method described here, so that all features disclosed for the method are also disclosed for the semiconductor chip and vice versa.

In particular, the optoelectronic semiconductor chip includes a semiconductor layer sequence, including a first semiconductor layer and a second semiconductor layer.

In particular, the semiconductor layer sequence includes a p-type semiconductor region and an n-type semiconductor region as well as an active layer arranged between the p-type semiconductor region and the n-type semiconductor region. In particular, the active layer can be a radiation-emitting active layer. The p-type semiconductor region, the n-type semiconductor region and the active layer can in each case include one or multiple semiconductor layers. The p-type semiconductor region contains one or multiple p-doped semiconductor layers and the n-type semiconductor region contains one or multiple n-doped semiconductor layers. It is also possible that the p-type semiconductor region and/or the n-type semiconductor region contain one or multiple un- doped semiconductor layers. The one or multiple layers of the p-type semiconductor region or of the n-type semiconductor region form the first and second semiconductor layer, respectively.

The active layer can e.g. be formed as a pn junction, as a double hetero structure, as a single-quantum well (SQW) structure or as multi-quantum well (MQW) structure. Here, the term quantum well structure includes any structure, in which charge carriers undergo a quantization of their energy states by confinement. In particular, the term quantum well structure does not include any information about the dimension of the quantization. Thus, inter alia, it includes quantum troughs, quantum wires and quantum dots and any combination of these structures.

The optoelectronic semiconductor chip further includes a first contact layer for electrically contacting the first semiconductor layer. The first contact layer extends laterally along the first semiconductor layer. Here, the first contact layer can include one or multiple sub-layers. For example, the first contact layer can include a connection layer such as a solder layer or an electrically conductive adhesive layer. For example, the first contact layer includes sublayers outside an optical path of the radiation to be generated or absorbed in the semiconductor layer sequence, for example of titanium or chromium, which contributes to good adhesion of the first contact layer. The first contact layer can further include a metallic, for example silver-containing, mirror layer for the radiation to be generated or absorbed in the semiconductor layer sequence. The first contact layer can further include a current expansion layer, for example. In particular, the first contact layer is formed to be electrically conductive.

The optoelectronic semiconductor chip further includes a third semiconductor layer on a side of the first contact layer facing away from the semiconductor layer sequence. The third semiconductor layer or a sub-layer thereof comprises a semiconductor material such as silicon or gallium arsenide. For example, the semiconductor material is an amorphous semiconductor material. The semiconductor material can have a doping, e.g. a boron or phosphor doping, for improved conductivity. Alternatively or additionally, the semiconductor material has a (manufacture-related) hydrogen doping, for example. The third semiconductor layer is in particular electrically connected to the first contact layer.

The optoelectronic semiconductor chip further includes a recess, which extends through the third semiconductor layer, the first contact layer and the first semiconductor layer and into the second semiconductor layer. The third semiconductor layer, the first contact layer and the first semiconductor layer are laterally interrupted in particular in a region of the recess. In particular, the optoelectronic can comprise multiple such recesses.

Furthermore, the optoelectronic semiconductor chip includes a passivation layer on a side of the third semiconductor layer facing away from the semiconductor layer sequence. The passivation layer includes at least one dielectric or electrically insulating layer, for example of silicon oxide or aluminum oxide. In particular, the passivation layer extends into the recess, so that a respective side surface of the third semiconductor layer of the first contact layer and of the first semiconductor layer is covered in the lateral direction toward the recess through the passivation layer at least in places.

The optoelectronic semiconductor further includes a second contact layer on a side of the passivation layer facing away from the semiconductor layer sequence. The second contact layer can include one or multiple sub-layers here.

For example, the second contact layer can include a connection layer such as a solder layer or an electrically conductive adhesive layer. The second contact layer can further include a metal mirror layer for the radiation to be generated or absorbed in the semiconductor layer sequence. The second contact layer can further comprise a transparent conductive oxide or consist of this. In particular, the second contact layer or a sub-layer thereof can be formed to be transparent. The second contact layer can e.g. further include a current expansion layer. In particular, the second contact layer is formed to be electrically conductive.

The first contact layer is electrically insulated from the second contact layer by the passivation layer. In particular, the passivation layer encloses the first contact layer and the third semiconductor layer at least partially. The passivation layer includes at least a first through-opening as well as at least one second through-opening. The at least one first through-opening is arranged in the region of the recess. The passivation layer is completely interrupted in the region of the at least one through-opening. The at least one second through-opening is arranged in a region of the third semiconductor layer. The passivation layer is completely interrupted in the region of the at least one second through-opening.

The second contact layer electrically contacts the second semiconductor layer in the region of the at least one first through-opening. Furthermore, the second contact layer electrically contacts the third semiconductor layer in the region of the at least one second through-opening. In particular, the second contact layer or a sub-layer thereof extends at least in places through the respective through-openings. The second contact layer in particular forms a through-connection, a so-called "VIA", of the second semiconductor layer through the recess. The second contact layer can also form multiple of such through-connections through multiple recesses, for example.

The second contact layer in each case forms a first contact surface to the second semiconductor layer in the at least one through-opening, and in each case a second contact surface to the third semiconductor layer in the at least one second through-opening. In particular, the second contact layer forms an electric connection of the respective contact surfaces. Advantageously, this enables a parallel or anti-parallel connection of electronic components electrically coupled with the respective contact surfaces.

In at least one embodiment according to the third aspect, part of the passivation layer is arranged between the first contact layer and the third semiconductor layer. The passivation layer comprises at least one further through-opening, so that the first contact layer electrically contacts the third semiconductor layer in the region of the at least one further through-openings. The passivation layer is in particular arranged on opposite sides of the third semiconductor layer. In particular, the first contact layer extends through the at least one further through-opening. The first contact layer forms in each case one third contact surface to the third semiconductor layer in the at least one further through-opening. Arranging the part of the passivation layer between the first contact layer and the third semiconductor layer allows setting or limiting in particular a current flow through the respective further contact surface.

According to a fourth aspect, an optoelectronic semiconductor chip is provided. The optoelectronic semiconductor chip can be produced in particular with a method described here, so that all features disclosed for the method are also disclosed for the semiconductor chip and vice versa. The optoelectronic semiconductor chip includes a semiconductor layer sequence, including a first semiconductor layer and a second semiconductor layer. The optoelectronic semiconductor chip further includes a first contact layer for electrically contacting the first semiconductor layer, which extends laterally along the first semiconductor layer. Furthermore, the optoelectronic semiconductor chip includes a recess, which extends through the first contact layer and the first semiconductor layer and into the second semiconductor layer.

The optoelectronic semiconductor chip further includes a passivation layer on a side of the first contact layer facing away from the semiconductor layer sequence, a third semiconductor layer on a side of the first contact layer facing away from the semiconductor layer sequence, as well as a second contact layer on a side of the passivation layer facing away from the semiconductor layer sequence.

The passivation layer comprises at least a first through-opening as well as at least a second through-opening. The second contact layer electrically contacts the second semiconductor layer in the region of the at least one first through-opening. Furthermore, the second contact layer electrically contacts the third semiconductor layer in the region of the at least one second through-opening. The optoelectronic semiconductor chip according to the fourth aspect comprises the same advantages as the optoelectronic semiconductor chip according to the third aspect.

In at least one embodiment according to the third or fourth aspect, the optoelectronic semiconductor chip comprises a carrier. The carrier can e.g. be produced by means of a casting method. In other words, the carrier is a so-called mold body, for example made of plastic material. The plastic material of the carrier preferably comprises a resin such as epoxy resin, a silicone or a hybrid resin containing an epoxy resin and a silicone. As an alternative, the carrier can e.g. be a sapphire or silicon substrate. For example, the carrier comprises one or multiple through-connections, which are in each case guided from a first main surface of the carrier facing the semiconductor layer sequence to a second main surface of the carrier facing away from the semiconductor layer sequence, so that the optoelectronic semiconductor chip can be contacted from the second main plane of the optoelectronic semiconductor chip. The optoelectronic semiconductor chip comprises in each case one contact, for example.

In at least one embodiment according to the third or fourth aspect, the recess extends completely through the third semiconductor layer, the first contact layer and the first semiconductor layer and into the second semiconductor layer.

In at least one embodiment according to the third or fourth aspect, the second contact layer extends from a side of the semiconductor layer sequence facing the first contact layer through the at least one first through-opening.

In at least one embodiment according to the third or fourth aspect, the third semiconductor layer forms a Schottky diode together with the first contact layer and/or the third semiconductor layer forms a Schottky diode together with the second contact layer. In particular, the first contact layer and the second contact layer each form a Schottky diode with their respective contact surfaces to the third semiconductor layer. These are particularly formed for the protection against electrostatic discharge (ESD) of the optoelectronic semiconductor chip. The Schottky diode(s) can also be referred to as (integrated) ESD protective element.

The ESD protective element has a directional electric conductivity. The semiconductor layer sequence also has a directional electric conductivity. The ESD protective element is arranged in particular parallel or antiparallel to the semiconductor layer sequence. The electric conductivity of the semiconductor layer sequence is significantly higher in the forward direction than that of the ESD protective element. Advantageously, a leakage current through the SD element can be kept low during operation of the optoelectronic semiconductor chip, which contributes to the efficiency of the optoelectronic semiconductor chip. Furthermore, the electric conductivity of the semiconductor layer sequence in the reverse direction is significantly lower than that of the ESD protective element, for example at least above a predetermined reverse voltage. Advantageously, a potentially destructive current in the reverse direction can be prevented through the semiconductor layer sequence, which contributes to a long life of the optoelectronic semiconductor chip. The optoelectronic semiconductor chip can also be referred to as a chip with intrinsic ESD stability. Integrating the ESD protective element in the optoelectronic semiconductor chip protects the ESD protective element in a particularly advantageous manner against external influence.

In a particularly advantageous manner, a current flow through the ESD protective element can be set or limited by a respective size of the second and third contact surfaces, for example by adjusting the respective second and further through-openings in the manufacture of the optoelectronic semiconductor chip. In the case that the part of the passivation layer between the third semiconductor layer and the first contact layer can be dispensed with, a large area occupation of the third contact surface in relation to a second contact surface limited by the at least one second through-opening is contributed to. For example, this allows influencing the directional electric conductivity of the ESD protective element or adjusting the reverse and forward characteristics of the ESD protective element.

In at least one embodiment according to the third or fourth aspect, the semiconductor layer sequence contains one of the following material systems:

$Al_xIn_yGa_{1-x-y}N$, $Al_xIn_yGa_{1-x-y}P$, or $Al_xIn_yGa_{1-x-y}As$, with in each case $0 \leq x \leq 1$, $0 \leq y \leq 1$ and $x+y \leq 1$, in particular with $x \neq 1$, $y \neq 1$, $x \neq 0$ and/or $y \neq 0$. Upon the generation of radiation, high internal quantum efficiencies can be achieved with the mentioned III-V semiconductor compound materials, in particular made of the mentioned material systems. The active layer of the semiconductor layer sequence, in particular, comprises such a material system.

In at least one embodiment according to the third or fourth aspect, the third semiconductor layer comprises or consists of at least one of the following materials:
  amorphous silicon (a-Si), in particular hydrogenated amorphous silicon, (a-Si:H). The latter is particularly suitable for the use as a Schottky contact.
  amorphous indium-gallium-zinc-oxide, (a-InGaZnO or also a-IGZO). Here, this may also be amorphous indium gallium zinc oxide, in which indium and gallium act as dopants.

In at least one embodiment according to the third and fourth aspect,
  the third semiconductor layer laterally surrounds at least one first through-opening in an annular manner, and/or
  the third semiconductor layer laterally borders at least a first through-opening in the type of a circular segment, and/or
  the third semiconductor layer borders at least a first through-opening in a laterally rectilinear manner, and/or the third semiconductor layer is formed laterally in the form of at least one character and/or at least one number.

A lateral shape of the first contact layer and/or of the first semiconductor layer can for example correspond to the lateral shape of the third semiconductor layer. In particular, a lateral shape of the at least one second and/or further through-opening and/or of the second contact layer may extend similarly to the lateral shape of the third semiconductor layer. Related to a lateral extension of the optoelectronic semiconductor chip, a flow of current can be set or limited by the respective lateral shape. In particular, one or multiple ESD protective component(s) integrated in the optoelectronic semiconductor chip can be assigned to one or multiple through-connection(s) of the second semiconductor layer.

The layers vertically enclosing the third semiconductor layer, e.g. in the direction of the first main plane and/or in the direction of the second main plane, can be of transparent design, for example. In an advantageous manner, the third semiconductor layer, in particular the lateral shape of the third semiconductor layer, can be used to mark the optoelectronic semiconductor chip. In particular, such a marking can be recognized or read by an observer or by an optical detection means externally from the optoelectronic semiconductor chip. This allows a particular simple assignment of the type of the optoelectronic semiconductor chip as an ESD protective component. Furthermore, a mounting surface or similar can be marked.

In at least one embodiment according to the third or fourth aspect,
  the third semiconductor layer is arranged laterally between at least two first through-openings, and/or
  the third semiconductor layer extends laterally along an edge region of the semiconductor chip. Advantageously, this allows achieving an effective ESD protection for multiple through-connections of the second semiconductor layer at a time.

In at least one embodiment according to the third or fourth aspect, the optoelectronic semiconductor chip is producible according to a method according to the first or second aspect.

Further features, designs and expediencies are indicated in the following description of the exemplary embodiments in conjunction with the Figures.

Figure 2:
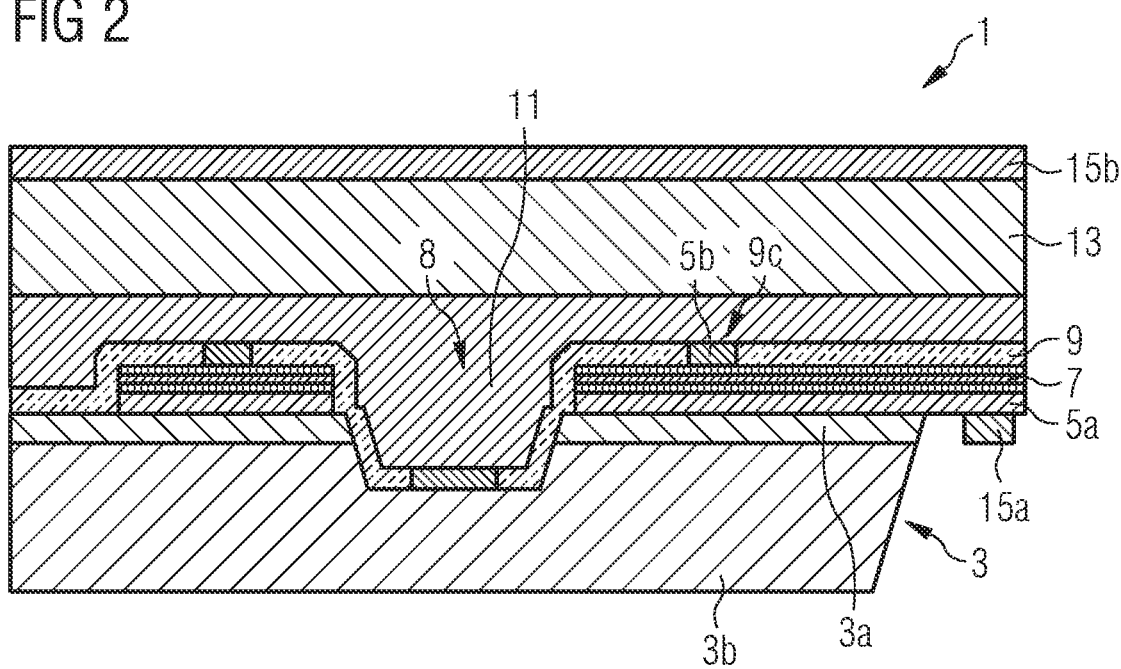
Figure 3:
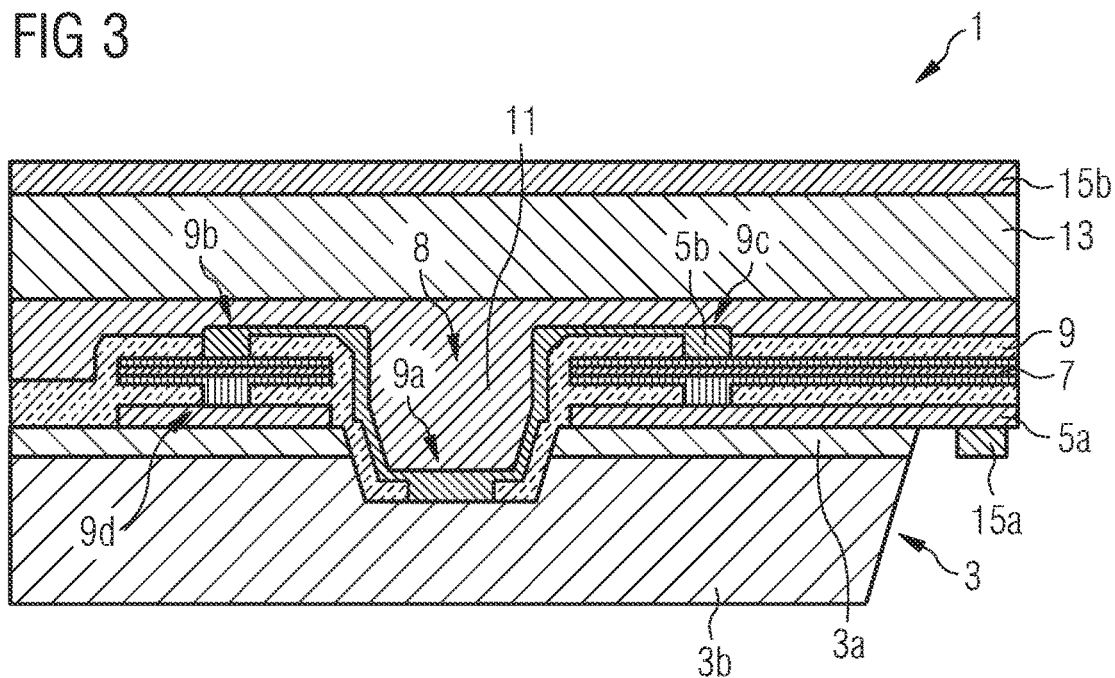
Figure 4:
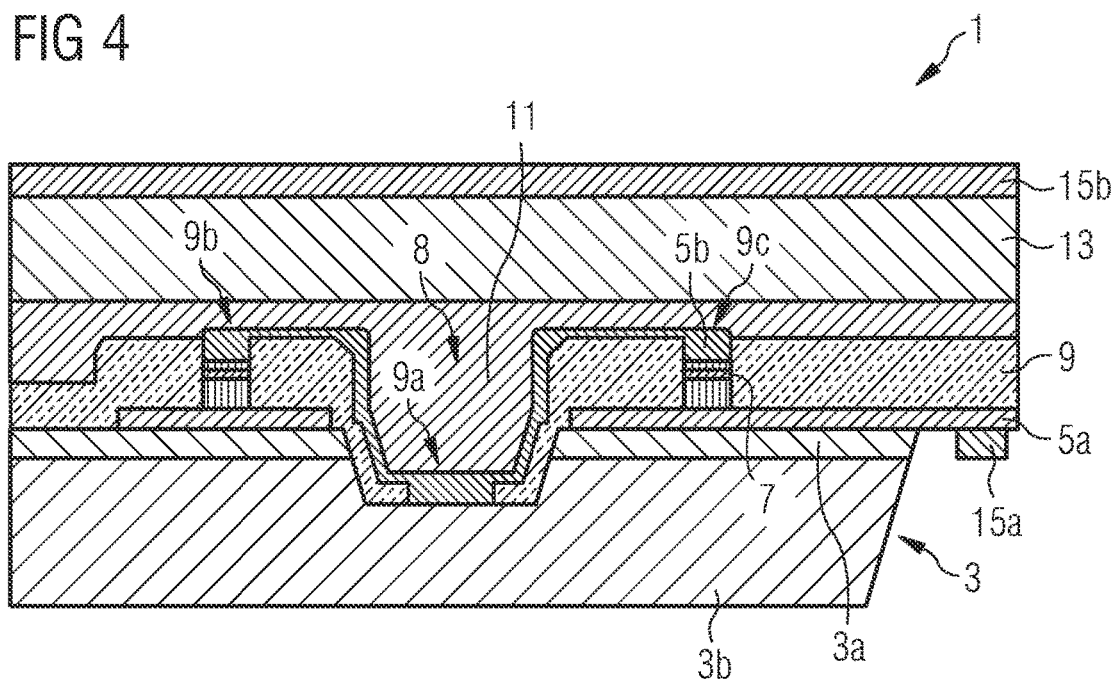

The figures show in:

FIG. 1 a first exemplary embodiment of an optoelectronic semiconductor chip in a schematic sectional view;

FIG. 2 a second exemplary embodiment of an optoelectronic semiconductor chip in a schematic sectional view;

FIG. 3 a third exemplary embodiment of an optoelectronic semiconductor chip in a schematic sectional view;

FIG. 4 a forth exemplary embodiment of an optoelectronic semiconductor chip in a schematic sectional view;

FIG. 5 a firth exemplary embodiment of an optoelectronic semiconductor chip in a schematic top view;

Like, similar or equivalent elements are indicated with the same reference characters throughout the figures. The figures and the size ratios of the elements illustrated in the figures are not to be considered as being true to scale. Rather, individual elements and in particular layer thicknesses can be illustrated in an exaggerated size for the purpose of a better illustration or a better understanding.

FIG. 1 shows a first exemplary embodiment of an optoelectronic semiconductor chip 1. In particular, the optoelectronic semiconductor chip 1 comprises an active region provided for the generation and/or or reception of electromagnetic radiation (not explicitly shown in the figures for the purpose of a simpler illustration). The optoelectronic semiconductor chip 1 is e.g. a thin-film light-emitting diode (LED) chip, in which the growth substrate has been removed. In other exemplary embodiments, it can be a so-called "flip chip" or a so-called "mold supported chip", for example.

The optoelectronic semiconductor chip 1 comprises a semiconductor layer sequence 3. In this exemplary embodiment, the semiconductor layer 3 includes a p-doped GaN layer as a first semiconductor layer 3a, and an n-doped GaN layer as a second semiconductor layer 3b. In deviation thereof, the semiconductor layer sequence 3, in particular the active region, can contain one of the semiconductor compound materials mentioned in the general section of the description.

A first contact layer 5a is arranged on a side of the first semiconductor layer facing away from the second semiconductor layer 3b. The first contact layer 5a covers the first semiconductor layer 3a preferably in a planar fashion in a contact region in such a way, that the first semiconductor layer 3a can be electrically contacted from a side facing away from the second semiconductor layer 3b. The first contact layer 5a extends as far as to a lateral edge region of the optoelectronic semiconductor chip 1, in particular laterally beyond the semiconductor layer sequence 3. A contact pad 15a (so-called "p-pad") is arranged in the laterally protruding portion of the first contact layer 5a and serves for electrical coupling the optoelectronic semiconductor chip 1.

A third semiconductor layer 7 is arranged on a side of the first contact layer 5a facing away from the semiconductor layer sequence 3. In this exemplary embodiment, the third semiconductor layer sequence 7 comprises hydrogenated amorphous silicon. The third semiconductor layer 7 or a sub-layer thereof further comprises dopants, e.g. of boron or phosphor, for example. As schematically shown in FIG. 1, the third semiconductor layer 7 includes multiple sublayers, for example. The sublayers can in particular have different doping concentrations. The sublayer arranged in the center has a high doping compared to the peripheral sublayers, for example.

The third semiconductor layer 7 forms a Schottky diode together with the first contact layer 5a. A flow of current through the Schottky diode can be set by a size of the contact surface between the first contact layer 5a and the third semiconductor layer 7.

The optoelectronic semiconductor chip 1 further includes a recess 8. The recess 8 extends completely through the third semiconductor layer 7, the first contact layer 5a and the first semiconductor layer 3a and into the second semiconductor layer 3b. A second contact layer 5b is arranged on a side of the third semiconductor layer 7 facing away from the semiconductor layer sequence 3 and extends into the recess 8. The second contact layer 5b is in particular arranged in direct contact with the second semiconductor layer 3b and serves for electrically-contacting the same. The second contact layer 5b can also be referred to as a through-connection or VIA. The second contact layer 5b in particular allows electrically-contacting the second semiconductor layer 3b from a side facing the first semiconductor layer 3a.

The optoelectronic semiconductor chip 1 further includes a passivation layer 9, which is arranged between the first and second contact layers 5a, 5b. The passivation layer 9 can be a dielectric or electrically-insulating layer, in particular. In particular, the passivation layer 9 extends along a side of the third semiconductor layer 7 that faces away from the semiconductor layer sequence 3 and covers the surfaces of the respective sublayers 3a, 3b, 5a, 7 of the optoelectronic semiconductor layer 1 that face the recess 8. The passivation layer 9 comprises a first through-opening 9a in the region of the recess 8, so that the electrical contacting of the second semiconductor layer 3b is made possible by the second contact layer 5b. The passivation layer 9 further comprises one or multiple second through-opening(s) 9b, 9c in the region of the third semiconductor layer 7, so that the electrical contacting of the third semiconductor layer 7 is made possible by the second contact layer 5b.

Furthermore, the third semiconductor layer 7 forms a further Schottky diode together with the second contact layer 5b. A current flow through the Schottky diode can be set by a size of the contact surface between the second contact layer 5b and the third semiconductor layer 7.

The two Schottky diodes are arranged opposite to one another, in particular, and form a so-called "back to back" diode (BTBD). This diode is connected to the semiconductor layer sequence 3 in parallel or antiparallel, in such a way that respective electric characteristics of the BTBD and of the semiconductor layer sequence 3 overlap during operation of the optoelectronic semiconductor chip 1. The BTBD is in particular configured to be current-blocking during operation of the optoelectronic semiconductor chip 1 with an operating voltage in the forward direction of the semiconductor layer sequence 3, so that this chip is flown-through only by currents in the range of several nanoamperes. Furthermore, the BTBD is formed in such a way that a breakdown voltage of the BTBD in operation of the optoelectronic semiconductor chip 1 is reached by a voltage in the reverse direction of the semiconductor layer sequence 3 significantly before reaching the breakdown voltage of the semiconductor layer sequence 3. For example, the semiconductor layer sequence 3 is operated with an operating voltage of 3 V in the forward direction. A breakdown voltage of the semiconductor layer sequence 3 is −90 V, for example. A breakdown voltage of the respective Schottky diodes can be formed symmetrically for example, it is 12 V, by way of example. The BTBD can also be referred to as ESD protective component.

The optoelectronic semiconductor chip 1 further includes a solder layer 11, which is arranged on a side of the passivation layer 9 respectively of the second contact layer 5b that faces away from the semiconductor layer sequence 3. In particular, the solder layer forms a common electrical contact together with the second contact layer 5b.

A silicon layer is arranged on a side of the solder layer 11 facing away from the semiconductor layer sequence 3, for example, this layer serving as a carrier 13 of the optoelectronic semiconductor chip 1. In other exemplary embodiments, the carrier 13 can for example be formed of sapphire or of a plastic material. Furthermore, in this exemplary embodiment, a connecting layer 15b is arranged on the carrier 13, which serves for electrical coupling the optoelectronic semiconductor chip 1, in particular the second contact layer 5b.

In this exemplary embodiment, the second contact layer 5b is formed in particular contiguously in one piece. In deviation thereof, the second contact layer 5b can be arranged only in the region of the through-openings 9a, 9b 9c of the passivation layer 9, as shown in a second exemplary embodiment in FIG. 2. The singulized parts of the second contact layer 5b are electrically-connected to one another via the solder layer 11.

In a third exemplary embodiment (see FIG. 3), a part of the passivation layer 9 is additionally arranged between the first contact layer 5a and the third semiconductor layer 4.

Electrically contacting the third semiconductor layer 7 is effected through a further through-opening 9d in the passivation layer 9. A size of the contact surface between the first contact layer 5a and the third semiconductor layer 7 is limited by a size of the further through-opening 9d, in such a way that a current flow through the respective Schottky diode can be further adjusted.

In a fourth exemplary embodiment (see FIG. 4), the optoelectronic semiconductor chip 1 is formed similar to the first to third exemplary embodiments and merely differs by the arrangement of the third semiconductor layer 7 as well as of the passivation layer 9. In particular, the third semiconductor layer 7 is formed only in the second through-openings 9b, 9c. The passivation layer 9 laterally completely encloses the third semiconductor layer 7. Due to a size of the through-openings 9b, 9c, a size of the contact surface between the first contact layer 5a and the third semiconductor layer 7 is limited, so that a flow of current through the respective Schottky diode can be limited or adjusted.

FIG. 5 shows a fifth exemplary embodiment of the optoelectronic semiconductor chip 1 in a plan view. The optoelectronic semiconductor chip 1 comprises 18 circular VIAs extending through respective first through-openings 9a of the passivation layer 9 (see FIGS. 1-4). The optoelectronic semiconductor chip 1, by way of example, includes multiple ESD protective elements of various shapes, which differ in particular by a lateral extension of the third semiconductor layer 7. Corresponding to this, a shape of the contact layers 5a, 5b of the through-openings 9b, 9c, 9d and of the first semiconductor layer 3a can vary as well.

The third semiconductor layer 7 extends, for example, in the lateral direction in an annular shape 7a. For example, the third semiconductor layer 7 surrounds a VIA in an annular manner. In deviation thereof, the third semiconductor layer can also extend around multiple or all VIAs of the optoelectronic semiconductor chip 1.

The third semiconductor layer 7 extends in the lateral direction in a circular arc segment 7b. For example, the third semiconductor layer 7 encloses one or multiple VIA(s) only in a circular arc. Here, an angle by which the third semiconductor layer 7 encloses the respective VIAs, may vary.

The third semiconductor layer 7 extends, for example, in the lateral direction in a linear region 7c next to one or multiple VIA(s).

The third semiconductor layer 7 forms separate knobs 7d, for example.

The third semiconductor layer 7 extends in the lateral direction along a chip edge region 7e, for example.

The third semiconductor layer 7 forms a curve 7f, for example, which extends in the lateral direction and in an arbitrary manner between and/or around one or multiple VIAs.

The third semiconductor layer 7 forms a sign 7g in lateral direction. Advantageously, a part of the optoelectronic semiconductor chip 1 that covers the third semiconductor layer 7 in a top view is of transparent design in a portion corresponding to at least sign 7g, such that the sign 7g can be discerned by an observer.

The third semiconductor layer 7 forms one or multiple character(s), in particular a sequence of characters 7h in the lateral direction. Advantageously, a part of the optoelectronic semiconductor chip 1 covering the third semiconductor layer 7 in a plan view is of transparent design at least in a portion corresponding to the character (s) in such a way, that the character (s) can be discerned by an observer. In particular, the character (s) can be letters.

The invention is not limited to the exemplary embodiments by the description by means of these exemplary embodiments. The invention rather comprises any new feature as well as any combination of features, which particularly includes any combination of features in the claims, even if this feature or this combination is per se not explicitly stated in the claims or the exemplary embodiments.

LIST OF REFERENCE CHARACTERS

1 Semiconductor chip
3 Semiconductor layer sequence
3a First semiconductor layer
3b Second semiconductor layer
5a First contact layer
5b Second contact layer
7 Third semiconductor layer
7a Ring shape
7b Circular arc segment
7c Linear region
7d Separate knob
7e Chip edge region
7f Curve
7g Sign
7h Character sequence
8 Recess
9 Passivation layer
9a First through-opening
9b, 9c Second through-opening
9d Further through-opening
11 Solder layer
13 Carrier
15a Contact plate
15b Connection layer

The invention claimed is:

1. A method for producing an optoelectronic semiconductor chip, comprising the steps:
    a) Providing a semiconductor layer sequence including a first semiconductor layer and a second semiconductor layer, as well as a first contact layer, which extends laterally along the first semiconductor layer and electrically contacts the same;
    b) Applying a third semiconductor layer on a side of the first contact layer facing away from the semiconductor layer sequence;
    c) Forming a recess, which extends through the third semiconductor layer, the first contact layer and the first semiconductor layer and into the second semiconductor layer;
    d) Applying a passivation layer on a side of the third semiconductor layer facing away from the semiconductor layer sequence;
    e) Forming at least a first through-opening and at least a second through-opening in the passivation layer; and
    f) Applying a second contact layer, wherein the second contact layer electrically contacts the second semiconductor layer in the region of the at least one first through-opening, and electrically contacts the third semiconductor layer in the region of the at least one second through-opening.

2. The method according to claim 1, in which
    additionally, a part of the passivation layer is applied on to a side of the first contact layer facing away from the semiconductor layer sequence; and
    at least one further through-opening is formed in the passivation layer, so that the first contact layer electrically contacts the third semiconductor layer in the region of the at least one further through-opening.

3. The method according to claim 1, in which the through-openings are formed by means of a chemical process.

4. The method according to claim 1, in which the through-openings are formed in a common method step.

5. The method according to claim 1, in which the third semiconductor layer comprises hydrogenated amorphous silicon, a-Si:H, and/or amorphous indium gallium zinc oxide, a-InGaZnO, or consists of at least one of these materials.

6. The method according to claim 1, in which the third semiconductor layer laterally surrounds at least one first through-opening in an annular manner, and/or the third semiconductor layer is laterally formed in the type of a circular segment and borders at least one first through-opening and/or the third semiconductor layer is formed laterally in the form of at least one sign and/or at least one character.

7. A method for producing an optoelectronic semiconductor chip, comprising the steps:
   a) Providing a semiconductor layer sequence including a first semiconductor layer and a second semiconductor layer, as well as a first contact layer, which extends laterally along the first semiconductor layer and electrically contacts the same;
   b) Forming a recess, which extends through the first contact layer and the first semiconductor layer and into the second semiconductor layer;
   c) Applying a passivation layer on a side of the first contact layer facing away from the semiconductor layer sequence;
   d) Forming at least one first through-opening and at least one second through-opening in the passivation layer;
   e) Forming a third semiconductor layer on a side of the first contact layer facing away from the semiconductor layer sequence; and
   f) Applying a second contact layer, wherein the second contact layer electrically contacts the second semiconductor layer in the region of the least one first through-opening, and electrically contacts the third semiconductor layer in the region of the at least one second through-opening.

8. The method according to claim 7, in which the through-openings are formed by means of a chemical process.

9. The method according to claim 7, in which the through-openings are formed in a common method step.

10. The method according to claim 7, in which the third semiconductor layer comprises hydrogenated amorphous silicon, a-Si:H, and/or amorphous indium gallium zinc oxide, a-InGaZnO, or consists of at least one of these materials.

11. The method according to claim 7, in which the third semiconductor layer laterally surrounds at least one first through-opening in an annular manner, and/or the third semiconductor layer is laterally formed in the type of a circular segment and borders at least one first through-opening and/or the third semiconductor layer is formed laterally in the form of at least one sign and/or at least one character.

12. An optoelectronic semiconductor chip, including a semiconductor layer sequence, including a first semiconductor layer and a second semiconductor layer, a first contact layer for electrically contacting the first semiconductor layer wherein the first contact layer extends laterally along the first semiconductor layer, wherein the optoelectronic semiconductor chip either includes
   a third semiconductor layer on a side of the first contact layer that faces away from the semiconductor layer sequence,
   a recess, which extends through the third semiconductor layer, the first contact layer and the first semiconductor layer and into the second semiconductor layer, and
   a passivation layer on a side of the third semiconductor layer facing away from the semiconductor layer sequence,
or the optoelectronic semiconductor chip includes
   a recess, which extends through the first contact layer and the first semiconductor layer and into the second semiconductor layer,
   a passivation layer on a side of the first contact layer facing away from the semiconductor layer sequence, and
   a third semiconductor layer on a side of the first contact layer facing away from the semiconductor layer sequence,
wherein the optoelectronic semiconductor chip further includes
   a second contact layer on a side of the passivation layer facing away from the semiconductor layer sequence, wherein
   the passivation layer comprises at least a first through-opening as well as at least a second through-opening,
   the second contact layer electrically contacts the second semiconductor layer in the region of the at least one first through-opening and electrically contacts the third semiconductor layer in the region of the at least one second through-opening.

13. The optoelectronic semiconductor chip according to claim 12, in which
   additionally, a part of the passivation layer is arranged between the first contact layer and the third semiconductor layer; and
   the passivation layer comprises at least one further through-opening so that the first contact layer electrically contacts the third semiconductor layer in the region of the at least one further through-opening.

14. The optoelectronic semiconductor chip according to claim 12, in which
   the second contact layer extends through the at least one first through-opening from a side of the semiconductor layer sequence facing the first contact layer.

15. The optoelectronic semiconductor chip according to claim 12, in which
   the third semiconductor layer forms a Schottky diode together with the first contact layer, and/or
   the third semiconductor layer forms a Schottky diode together with the second contact layer.

16. The optoelectronic semiconductor chip according to claim 12, in which the semiconductor layer sequence contains one of the following material systems:
   $Al_xIn_yGa_{1-x-y}N$, $Al_xIn_yGa_{1-x-y}P$, $Al_xIn_yGa_{1-x-y}As$, with in each case $0 \leq x \leq 1$, $0 \leq y \leq 1$, and $x+y \leq 1$.

17. The optoelectronic semiconductor chip according to claim 12, in which
   the third semiconductor layer comprises hydrogenated amorphous silicon, a-Si:H, and/or amorphous indium gallium zinc oxide, a-InGaZnO, or consists of at least one of these materials.

18. The optoelectronic semiconductor chip according to claim 12, in which
- the third semiconductor layer laterally surrounds at least one first through-opening in an annular manner, and/or
- the third semiconductor layer laterally borders at least one first through-opening in the type of a circular segment and/or
- the third semiconductor layer borders at least one first through-opening laterally in a rectilinear manner, and/or
- the third semiconductor layer is formed laterally in the form of at least one sign and/or at least one character.

19. The optoelectronic semiconductor chip according to claim 12, in which
- the third semiconductor layer is arranged laterally between at least two first through-openings, and/or
- the third semiconductor layer extends laterally along an edge region of the semiconductor chip.

20. The optoelectronic semiconductor chip according to claim 12, in which
- the third semiconductor layer laterally surrounds at least one first through-opening in an annular manner, and/or
- the third semiconductor layer is laterally formed in the type of a circular segment and borders at least one first through-opening and/or
- the third semiconductor layer is formed laterally in the form of at least one sign and/or at least one character.

\* \* \* \* \*